United States Patent [19]
Johnson

[11] Patent Number: 5,688,721
[45] Date of Patent: Nov. 18, 1997

[54] 3D STACK OF IC CHIPS HAVING LEADS REACHED BY VIAS THROUGH PASSIVATION COVERING ACCESS PLANE

[75] Inventor: Tony K. Johnson, Irvine, Calif.

[73] Assignee: Irvine Sensors Corporation, Costa Mesa, Calif.

[21] Appl. No.: 622,671

[22] Filed: Mar. 26, 1996

Related U.S. Application Data

[63] Continuation of Ser. No. 213,149, Mar. 15, 1994, abandoned.

[51] Int. Cl.$^6$ .................. H01L 21/283; H01L 21/56; H01L 21/60; H01L 21/70
[52] U.S. Cl. .................. 437/203; 437/208; 437/915
[58] Field of Search .................. 437/203, 208, 437/915

[56] References Cited

U.S. PATENT DOCUMENTS

| | | | |
|---|---|---|---|
| 3,029,495 | 4/1962 | Doctor | 437/208 |
| 3,370,203 | 2/1968 | Kravitz et al. | 437/208 |
| 4,525,921 | 7/1985 | Carson et al. | 29/577 |
| 4,617,160 | 10/1986 | Belanger et al. | 264/40.1 |
| 4,672,737 | 6/1987 | Carson et al. | 29/572 |
| 5,104,820 | 4/1992 | Go et al. | 437/51 |
| 5,107,586 | 4/1992 | Eichelberger et al. | 29/830 |
| 5,149,419 | 9/1992 | Sexton et al. | 205/75 |
| 5,279,991 | 1/1994 | Minahan et al. | 437/208 |

*Primary Examiner*—David Graybill
*Attorney, Agent, or Firm*—Thomas J. Plante

[57] ABSTRACT

A process in which a plurality of IC chips are stacked in a unitary structure having a novel method of exposing leads on the access plane of the stack. After a layer of dielectric material has been formed on the access plane, trenches (preferably trenches) are formed, e.g., by wet lithographic processing, which expose the access plane leads. Thereafter terminals are formed on the access plane in contact with the leads. At the wafer level, layers of dielectric material are deposited which are sufficiently thick to permit the subsequent forming of trenches in the access plane dielectric without uncovering any of the silicon of the IC chips.

20 Claims, 10 Drawing Sheets

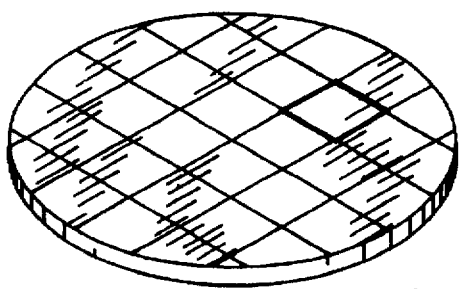
FIG. 1a          FIG. 1b
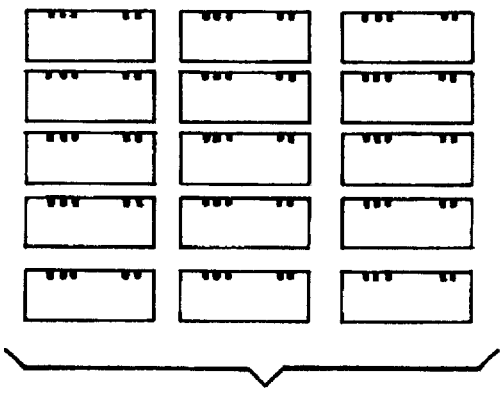
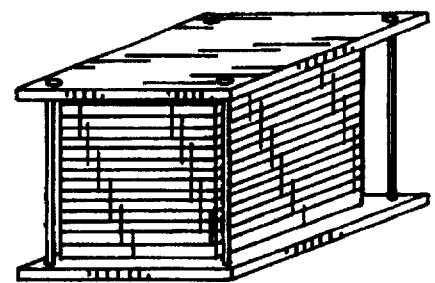
FIG. 1c          FIG. 1d
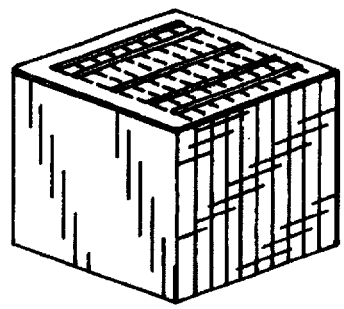
FIG. 1e

3D STACK OF IC CHIPS HAVING LEADS REACHED BY VIAS THROUGH PASSIVATION COVERING ACCESS PLANE

This application is a continuation of application Ser. No. 213,149, filed Mar. 15, 1994, abandoned.

BACKGROUND OF THE INVENTION

This invention relates to a structure and method in which a number of IC semiconductor chips (e.g., silicon) are secured together in an integrated stack having at least one access plane on which a multiplicity of electrical leads are available for external connection.

It is concerned with simplifying and improving the current method of forming such stacks, which has been described in numerous common assignee patents. Of particular relevance are U.S. Pat. Nos. 4,525,921 and 4,672,737. U.S. Pat. No. 4,672,737 relates to a stack of IC chips which has a photo-detector array at one end. U.S. Pat. No. 4,525,921 relates to a stack of IC chips which provides a high-density electronic module, useable for numerous purposes, such as computer memory.

Both patents claim methods of forming the "access" plane of the stack, i.e., a plane of the stack which has leads coming from the integrated circuitry to be available for connection to exterior circuitry, or to photodetectors. Because the chips are formed of semiconductor material, their access plane surface must be covered with passivation before conductors can be formed on the access plane. The leads from the IC circuitry must be exposed on the access plane. And the leads must be prevented from having any contact with the silicon layers, in order to avoid short-circuiting.

In the methods shown in the two patents identified above, the access plane surface of the stack is subjected to a three-step process. It is first etched back to remove some of the silicon, leaving the metallic leads protruding. Then the entire surface is covered with a suitable passivation material, such as an appropriate polyimide. Next, the surface is lapped to expose the ends of the metallic leads. Thereafter, metalization can be placed in contact with the leads, or photodetectors can be connected to the leads.

The process just described has heretofore been considered necessary in building 3D stacks of silicon chips, although it has added complexity to the overall method, and the need for etching has been considered a special problem. The protruding leads after etching tend to be fragile. This may call for a dry etching process, e.g., plasma etching. The use of a charged field in plasma etching has the potential of damaging the IC chips, thus requiring extreme care during the etching process. Another etching problem may exist when modified silicon chips are used for the purpose of adapting mass-produced chip-containing wafers to the production of chips for use in memory stacks. Certain material from the wafer streets must be removed from the access plane of the chip stack, e.g., by wet etching.

The primary goal of the present invention is to eliminate the need for etching back of the silicon in the stack. Elimination of the etching back step will also have the major benefit of saving substantial amounts of silicon, and generally simplifying the manufacturing process. Such simplification is desirable, and perhaps necessary, for use in large quantity manufacturing.

SUMMARY OF THE INVENTION

The present invention eliminates the etching of the silicon on the access plane. A layer of passivation is applied over the original access plane, and openings are formed in the passivation layer to uncover the leads which connect to the integrated circuitry.

This simplification is made possible in part by separating the metal leads from each of the adjacent silicon layers by a sufficiently thick passivation layer. Combining the greater spacing with improved alignment technology, it is feasible to form openings through the passivation on the access plane to uncover the individual metal leads in the stack, without danger of reaching any silicon. The metal leads may then be used to form T-connects which become part of terminals and/or buses on top of the access plane.

In prior IC chip stacks, the passivation between adjacent silicon layers has generally been quite thin; and the epoxy which has glued the layers together has also been very thin. This means that the metal leads at the access plane would be targets difficult to consistently hit by openings formed in the passivation covering the access plane.

The preferred passivation layers between IC chip layers are formed by depositing a suitable polyimide material. Although less thick passivation is feasible, a relatively thick polyimide layer, e.g., 8 microns, may be formed on each side of the leads, insulating them from the silicon. The use of thicker passivation has electrical benefits, as well as simplifying the processing steps.

An advantage of the new process is that key steps are accomplished at the wafer level, i.e., the passivation layers which will separate silicon IC chip layers in the stack are formed on the wafer surface before dicing the wafer to provide individual chips.

A significant benefit of the present invention is that it simplifies extensive utilization of aluminum metalization. Such metalization was made more difficult by the etching used to remove residual aluminum from the completed stack of chips. With the present invention, extensive accumulated technology relating to the aluminum-based metallurgy relevant to semiconductor metalization is available for use throughout the wafer-processing steps, including those involving polyimide as a dielectric material.

BRIEF DESCRIPTION OF THE DRAWINGS

FIGS. 1a–1e represent the general stages of the process from the wafer processing to the stack processing;

DETAILED DESCRIPTION OF SPECIFIC EMBODIMENTS

The novel process and product of the present invention can best be introduced by simple figures which begin with wafer level processing of dice, and end with processing of the access plane of a laminated stack of IC chips. The steps performed before the wafer is diced (sawed) to provide many separate chips are relevant to the steps performed to provide suitable passivation and metalization (circuitry) on the access plane of the completed stack of chips.

FIGS. 1a through 1e represent the general stages of processing involved in the present invention. FIG. 1a represents a wafer containing numerous IC chips (or dice). For reasons of economic practicability, the current plan is to use off-the-shelf wafers, i.e., wafers which are already being mass produced by vendors of IC chips. In order to derive IC chips suitable for stacking from off-the-shelf wafers, rerouting from the built-in terminals on a given die is needed to bring all of the traces (metallic conductors) from the original terminals of the die to one edge of the IC chip which is modified for stacking, i.e., to the edge of the chip which will form part of the access plane of the completed stack.

As represented in FIG. 1b, a stackable IC chip, which has been diced from the modified wafer, has a rectangular area. In practice, the areas of the stackable chips may range from rectangular chips having a 1:2 aspect ratio to chips which are essentially square. The early modification process has used the area of more than one die (e.g., the area of 2 to 6 dice) to provide a single stackable chip. The volume of stacks manufactured may reach a point at which wafer vendors will pre-design the wafer dice to make them ready for stacking without modification (rerouting). This obviously would provide significant manufacturing economies.

FIG. 1c represents a plurality of chips ready for stacking, after wafer level processing and dicing. FIG. 1d represents a stack of chips mounted in a laminating fixture. Adhesive material is located between each pair of adjacent chips. The stack is subjected to pressure, and generally to heat, in order to cause adhesion of the chips to one another.

FIG. 1e represents a stand alone stack of chips, and also shows the access plane of the stack, on which electrical terminals and buses have been provided.

Figure 2:
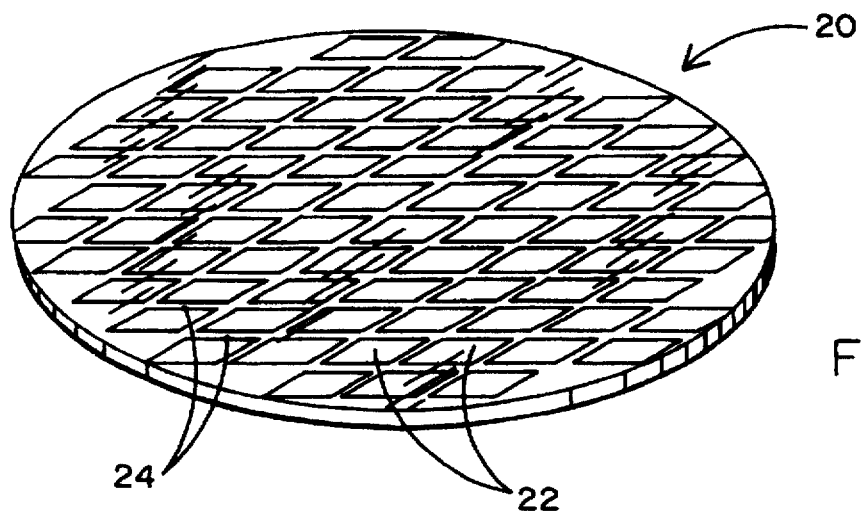
FIG. 2 is an isometric view representing a wafer as supplied prior to the special processing needed to create a functioning stack of chips.

In FIG. 2, a vendor supplied silicon wafer 20 is shown, having a large number of dice (chips) 22, separated from one another by orthogonal streets 24. Wafers are typically 4", 5", 6" or 8" in diameter. They contain tens to hundreds of chips, which will be separated by dicing, i.e., sawing along the streets. Each chip contains integrated circuitry (IC) capable of performing electronic functions.

Figure 3:
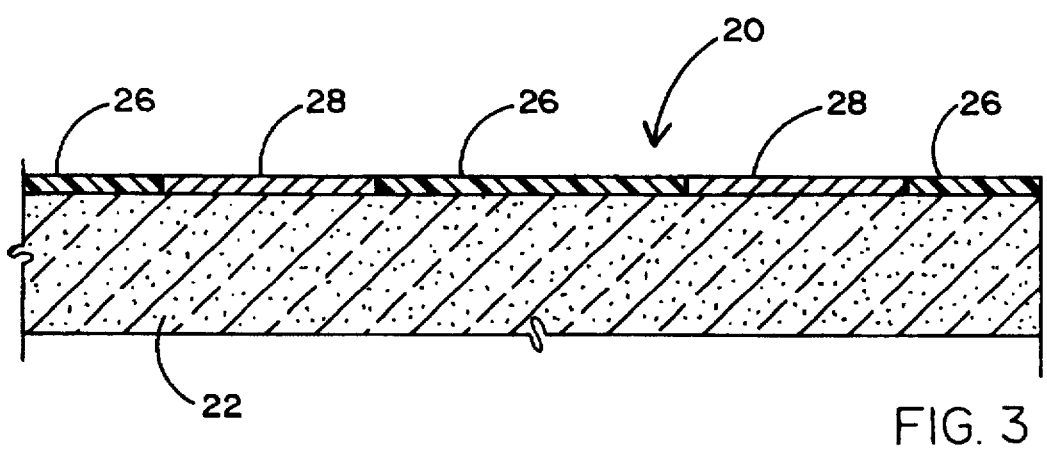
FIG. 3 is a section through a very small portion of the wafer of FIG. 2.

FIG. 3 shows a cross-section through a small portion of wafer 20. As supplied by the vendor, the surface of the wafer is covered by a layer of passivation (insulating material) 26, except in those locations where metal terminals 28 (usually aluminum) are formed. The terminals 28 are electrically connected to the IC circuitry within the respective chips. The passivation layer 26 may be formed of various materials, e.g., silicon oxide, silicon nitride, silicon oxynitride; and it may be approximately 1 micron thick. The aluminum terminals (or pads) may also be about 1 micron thick. The silicon material forming chips 22 may be from 500–625 microns thick initially. Before dicing, the silicon material in the wafer will be thinned, in order to reduce chip thickness, to approximately 100–375 microns.

In the earlier stacks of IC chips, which were designed primarily as focal plane modules rather than memory modules, the space between adjacent chips, i.e., the "glue line", was kept very thin, e.g., from 0.02 mil. to 0.10 mil (see U.S. Pat. No. 4,617,160). During the "lamination" process, stacked chips were caused to adhere by using heat and pressure, after the chips had been stacked in a suitable fixture. Suitable insulation of the leads was provided by thin passivation layers on the upper and lower surfaces of each chip.

More recent chip-stacking technology, as disclosed in common assignee U.S. Pat. No. 5,104,820, has applied a layer of additional passivation over the vendor-supplied wafer, then metalization designed to bring the leads of the separate chips to a single edge of each chip, and finally another layer of passivation over the leads. This has the effect of substantially increasing the distance between adjacent chips in the stack. As explained in U.S. Pat. No. 5,104,820, the use of second level metal conductors, lying above a thicker layer of passivation, has certain important electrical advantages in the laminated stack.

Where the second level metal conductors are rerouted above the conductors formed on the active face of a chip, the thickness of the passivation layer is determined in part by the potential problem of cross-talk. The distance between the second level conductors and the inactive underside of the next chip, i.e., the thickness of the passivation layer above the conductors, is determined in part by the potential problem of capacitance. Generally, the capacitance problem requires less dielectric thickness then the cross-talk problem.

In U.S. Pat. No. 5,104,820 several materials were suggested for forming the passivation layer between each silicon chip and the second level conductors, including silicon compounds and appropriate types of polyimide material. Continuing experience has led to a preference for polyimide materials. They have a relatively low dielectric constant, and they lend themselves to formation of thicker layers. The preference for polyimide passivation between chips is a change from the earlier desire to maintain very thin adhesive lines.

Although thicker dielectric layers between silicon chips have advantages from an electrical standpoint, they have disadvantages from a mechanical integrity standpoint. Because the polyimide material has a higher coefficient of thermal expansion than the silicon or the metal, greater thickness of polyimide layers can cause mechanical reliability problems. Thus, a suitable trade off between the electrical and mechanical preferences must be established.

Figure 4:
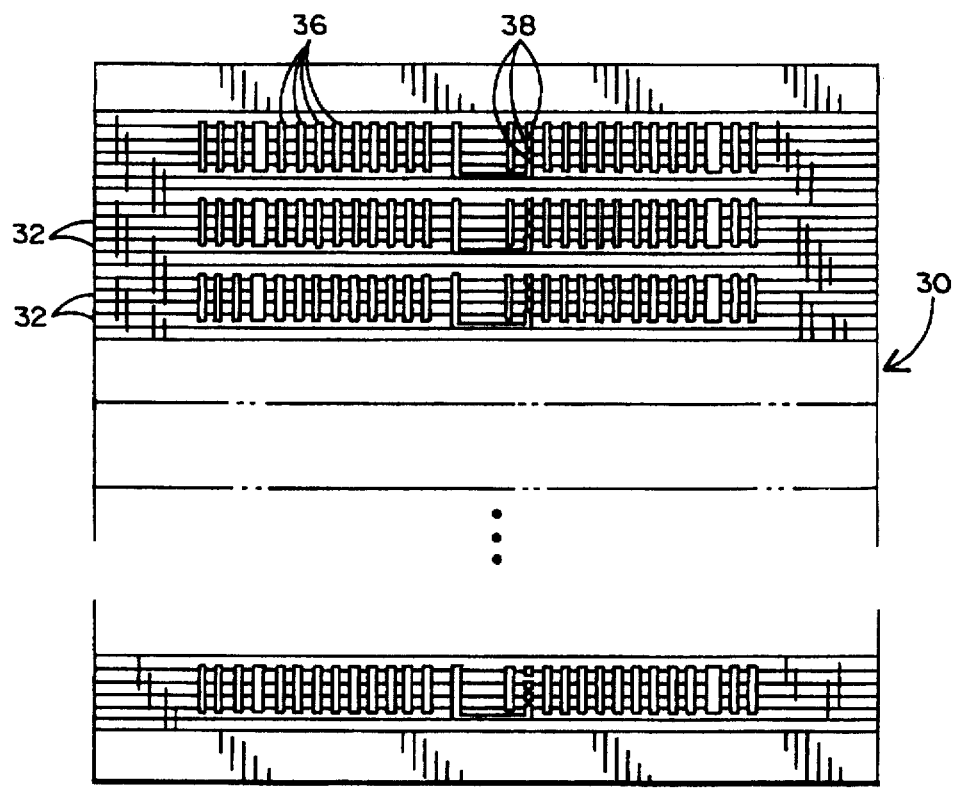
FIGS. 4 and 5, which correspond, respectively, to FIGS. 1 and 2 of U.S. Pat. No. 5,279,991, illustrate the "final result" after stack lamination and metalization have been completed.
Figure 5:
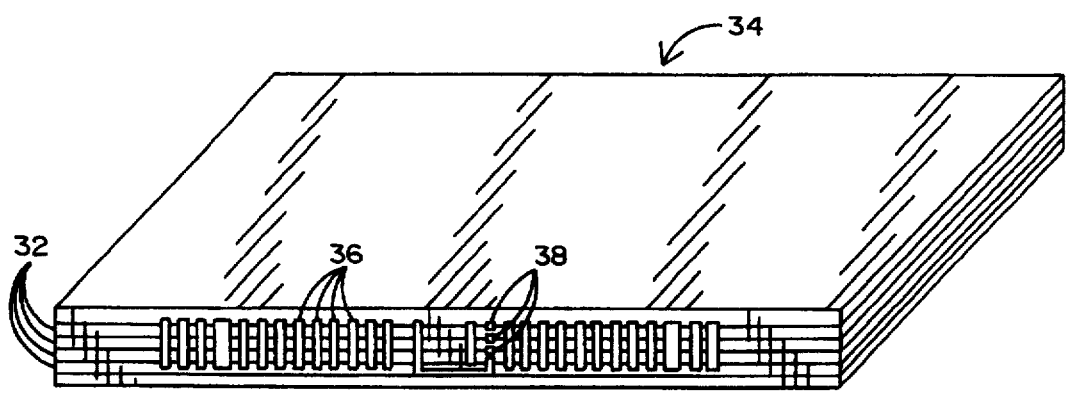

Before providing a further description of the wafer level processing, it will be useful to show the final result after the lamination process has been completed. FIGS. 4 and 5 correspond, respectively, to FIGS. 2 and 4 of common assignee U.S. Pat. No. 5,279,991. Both of the figures show chips in a "pancake" stack, which is a one of two basic arrangements, the other being referred to as a "sliced bread" stack. The present invention is equally applicable to both types of stacks (pancake and sliced bread).

FIG. 4 is a front view of the access plane of a large stack 30 containing numerous chip layers 32. The processes needed to provide insulation and metalization on the access plane are performed on the large stack 30. Then the large stack is segmented to form a plurality of short stacks 34, one of which is shown isometrically in FIG. 5. Each short stack 34 contains a predetermined number of active layers (i.e., layers having internal integrated circuitry).

The shape of the large stack and also of each small stack is generally that of a rectangular parallelepiped. The layers are shown having a substantially greater width dimension than depth dimension. The metal leads need to come to one edge of each stacked chip, i.e., the edge which is part of the access plane of the stacks.

As shown in both FIGS. 4 and 5, electrically conductive metalization has been formed on the access plane, which metalization is electrically connected to leads from the integrated circuitry in the active chips; but both the leads and the metalization are insulated from the silicon semiconductor material of the chips. The access plane metalization seen in FIGS. 4 and 5 includes both numerous vertically extending buses 36 which reach all the chips in the short stack, and also individual terminal pads 38 which permit separate access to each chip.

A significant consideration in deciding the number of IC chips to include in the large stack of FIG. 4 is the acceptable aspect ratio of the area dimensions of the access plane. As seen in FIG. 4, the vertical and horizontal dimensions of the large stack are substantially the same, i.e., they have an aspect ratio close to 1:1. In effect, the horizontal dimension of the aspect plane tends to limit the number of chips which can be included in the stack. This is true because current processing utilizes spinning in applying materials to the access plane, e.g., polyimide and photoresist materials. Significant variability in thickness of spun-on layers of material tends to occur as the aspect ratio varies from 1:1. A circle is the ideal area for spun-on layers; and a square is preferable to a rectangle. If the longer horizontal dimension of each chip in the stack is, say, 15 millimeters, the height of the large stack generally should not be greater than 20–23 millimeters. Increasing the number of chips in the large stack has the advantage of reducing the per chip processing cost when the access plane is processed.

There are other processes than spinning, which might be used to avoid the aspect ratio limitations discussed in the preceding paragraph. Such methods of applying liquid materials to the access plane include curtain coating, roller coating, meniscus coating, spray coating, and transfer.

Figure 6:
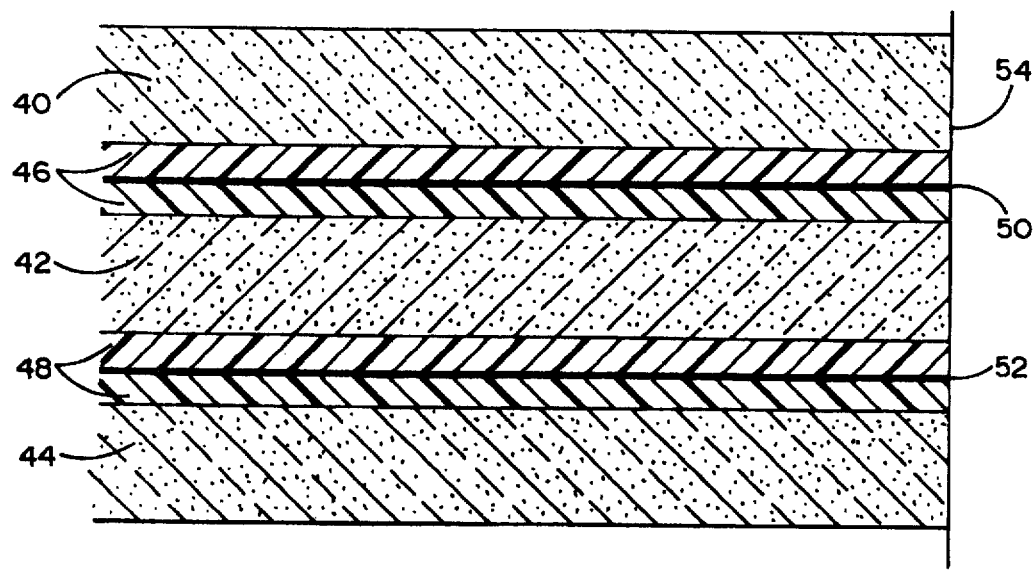
FIG. 6 is a sectional view taken through a plurality of stacked IC chips.

FIG. 6 is included to clarify the relationship between individual stacked chips, the dielectric material surrounding them, and the electrical leads which connect the interior integrated circuitry to the exterior electrical terminals and buses. The figure is a cross-section through a plurality of stacked silicon chips, separately identified by numerals 40, 42 and 44. A dielectric layer 46 separates chip 40 from chip 42; and a dielectric layer 48 separates chip 42 from chip 44. Each dielectric layer 46 and 48 has metallic conductors located between the adjacent chip surfaces, at a suitable distance from each of such surfaces. A large number of parallel conductors are represented by line 50 embedded in dielectric layer 46; and a large number of parallel conductors are represented by line 52 embedded in dielectric layer 48. The conductors 50 and 52 are commonly referred to as "traces". They extend to the access plane 54 of the stack of chips, where they are available for electrical connection to circuitry outside the stack.

The dielectric materials are preferably selected from the broad category of polyimide materials. Among polyimides which have been successfully used in layers 46 and 48 have been "DuPont" supplied polyimides, e.g., "DuPont No. 2611", chosen because it has a low coefficient of expansion. The layers 46 and 48 of dielectric polyimide material, and the electrical conductors 50 and 52, are formed at the wafer processing level, prior to stacking of the chips. The layers of adhesive material which hold the stacked chips together are not shown in FIG. 6.

Figure 7:
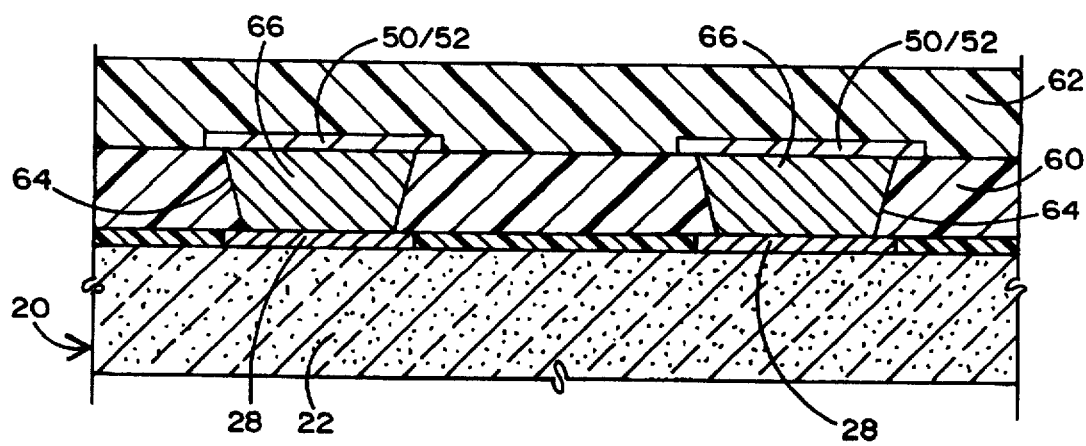
FIG. 7 is a sectional view taken through a wafer showing the structure after wafer level processing.

This description now returns to the wafer level processing. In a series of steps performed on a wafer, such as the wafer represented in FIG. 1a, a structure is gradually built up to provide the cross-section shown in FIG. 7. FIG. 7 shows a wafer cross-section which is limited to a very small portion of the wafer (within a single die). In FIG. 7, two layers 60 and 62 of passivation polyimide have been applied to the surface of the wafer, with metal conductors between the two layers. Each layer of passivation polyimide may be formed by a plurality of layering processes, depending on the desired thickness.

The first layer 60 of passivation polyimide initially covered the surface of the wafer. Then vias 64 were formed in the layer 60, in order to expose the terminals 28 on the silicon wafer 20. After exposure of terminals 28, metal terminals 66 (preferably aluminum) were formed in the vias, in order to provide electrical connections from each terminal on the wafer to one of the leads 50, 52, which will become the embedded leads 50 and 52 of FIG. 6. In forming the polyimide layers 60 and 62, polyimide material in liquid form is "cast on" the wafer surface, i.e., spun on, sprayed on, or otherwise caused to cover the surface of the wafer. The polyimides used in the dielectric layers, which adhere to the surface they are cast on, are condensation polymers having a very low initial solid content. After each layer has been applied in liquid form, it must be dried to remove solvent, which may be 80% of the cast on material. Adhesion of polyimide layers may be ensured by use of suitable adhesion promoters.

As stated above, each layer 60 and 62 of dielectric polyimide may itself have a plurality of sub-layers, each of which requires curing after the liquid material has been cast on the wafer surface. The upper surface of each layer after curing tends to be somewhat uneven, due to the uneven surface below the layer. The thickness of dielectric layers 60 and 62 may be selected to fit the specific situation. In the version disclosed herein, a thickness of 8 microns has been suggested for each layer. In other words, layer 60 after curing is approximately 8 microns thick, layer 62 after curing is approximately 8 microns thick, and the total dielectric thickness is approximately 16 microns. The thickness of the metal conductors 50 and 52 is approximately 2 microns.

The selected thicknesses of each of the polyimide layers 60 and 62 may vary over a wide range, from the minimum needed to permit locating the conductors 50 and 52 using conventional photolithographic trench-opening techniques, to a maximum in the neighborhood of 15 microns. The thickness selections will be determined by at least four considerations, two of which argue for more thickness, and two of which argue for less thickness. Greater thickness, as stated above, reduces electrical problems, i.e., cross-talk and capacitance. It also makes processing easier, as will be clear from subsequent description. On the other hand, lesser thickness improves mechanical integrity because fatigue failures in the metal conductors are less likely, and lesser thickness reduces problems due to thermal expansion and contraction.

The present example, in which the layers 60 and 62 are each about 8 microns thick, is considered a reasonable compromise. Actual development work has used a total thickness between adjacent silicon chips of about 26 microns.

For the present description, a thickness of 8 microns for each layer 60 and 62 has been selected; and an assumption has been made that each layer 60 and 62 will comprise more than one thinner sub-layer. Whether each layer 60 and 62 is formed as a single layer or as a plurality of sub-layers is a matter of choice. Forming a single layer is a simpler overall process. Forming multiple sub-layers permits tighter process control.

Figure 8A:
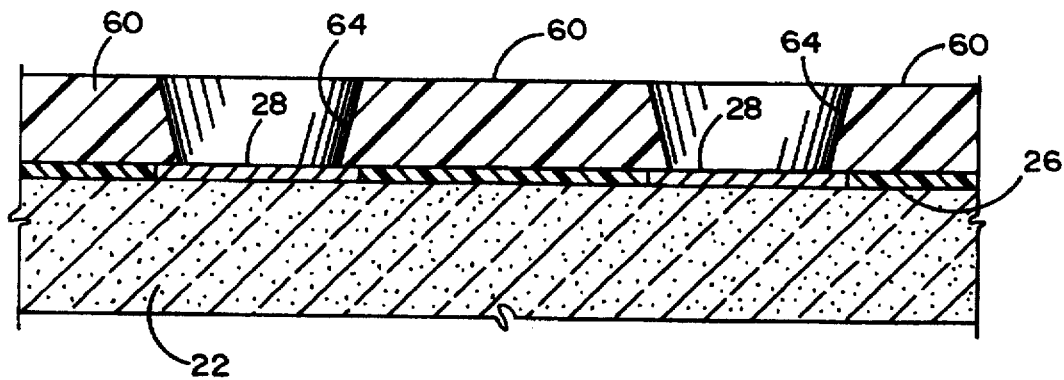
FIGS. 8a–8d are sectional views showing the step-by-step wafer processing which results in the structure of FIG. 7.

The following is a more detailed description of step by step processing performed at the wafer level, using the example in which two sub-layers constitute each of the 8 micron dielectric layers. FIGS. 8a–8d are successive cross-sectional views through the same wafer as shown in FIGS. 3 and 7, but at right angles to those figures. FIG. 8a shows the cross-section after the first 8 micron layer of polyimide 60 has been applied to the top of the wafer. The 8 micron layer may, as explained, comprise two 4 micron layers, separately cast on, baked, and cured. The first layer would be cast as a film of polyimide which will be 4 microns thick after cure. Then a step called a "soft bake" is performed. The soft bake drives off all of the solvent, but does not cure the polyimide. It is left in the form of a polyamic acid at that point, which is a dry film. It has a degree of structural integrity but not full integrity.

The next step is opening of vias through the dielectric layer down to the metal pads 28. There are several suitable methods for forming the vias, including a plasma process and a laser process. The following description relates to a wet developer process. First, a layer of photoresist is deposited on top of the soft baked polyimide. The photoresist is exposed using an appropriate photo mask to permit opening of vias down to the underlying metal pads 28, where the metal terminals 66 ultimately need to connect. The photoresist is developed to open up the exposed photoresist. The material used in developing also is a solvent for the soft baked polyimide, i.e., the polyamic acid is soluble in the photo developer material. So wherever an area was exposed to make a via, the developer also in that area washes away the polyimide to expose the underlying aluminum pad. Then the photoresist is stripped away.

The next step is to perform a final cure on that layer of polyimide. The soft bake temperature is somewhere between 150° temperature is about 350° C.

After curing the first 4 micron layer, another layer of polyimide may be cast, thick enough to ultimately be 4 microns thick after final cure. Again a soft bake is performed, a photoresist layer is applied and then exposed through a mask. This mask at the vias has the via size slightly larger. For instance, if 100 micron wide vias were opened in the first layer of polyimide, in the next layer of polyimide the vias would probably be 110 microns wide. That provides a slight angle on the walls of the vias in the polyimide. After exposure through the mask, the developer is used, to open the vias through the dielectric. Then the remaining photoresist is stripped, and another final cure is performed. So at this point there is an 8 micron layer of polyimide that is fully cured, and vias extend down through that polyimide to all of the aluminum pads that will be connected to traces. The vias have sloped side walls, which facilitates getting good metalization coverage to provide sufficient integrity of the electrical connections.

Figure 8B:
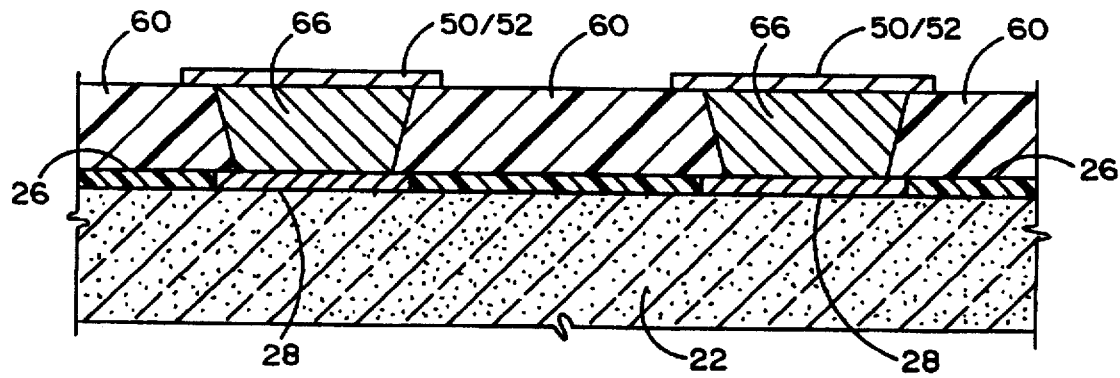

The next step relates to metalization of the wafer. FIG. 8b shows the cross-section of FIG. 8a, after metalization has been formed on the wafer. This metalization comprises both the metal terminals 66 in the vias and the traces 50–52 which lead from terminals 66 to the access plane edges of the chips. Photolithography is used to confine the metal (preferably aluminum) to the via locations and to the paths of the traces. The traces are shown in cross-section in FIG. 8b, contacting the respective terminals 66. The method currently used for depositing aluminum to provide the via and trace metalization is evaporation. However, sputtering or plating may be used for the same purpose. The aluminum metalization may include small amounts of other metals (e.g., copper) because of standardization in the integrated circuit industry.

Figure 8C:
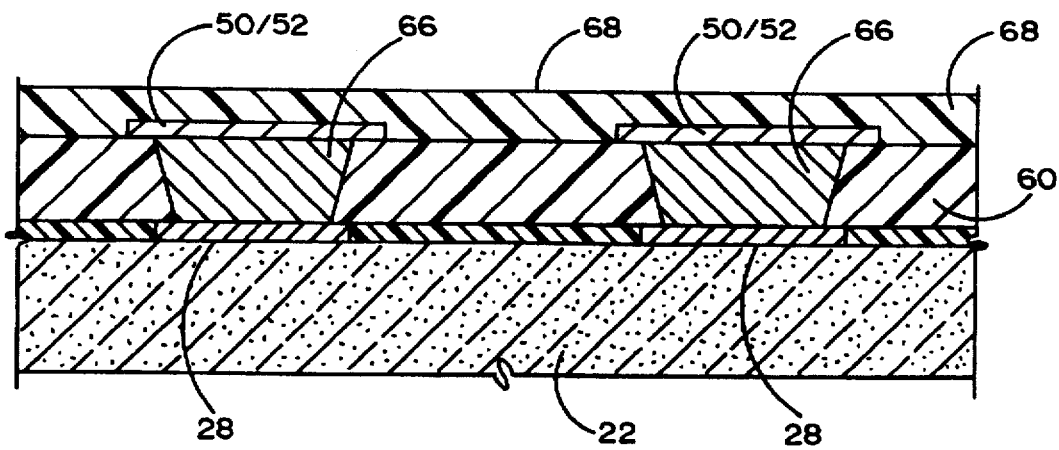

FIG. 8c shows the cross-section of FIG. 8b, after a 4 micron layer 68 of polyimide has been formed on top of the metalization. The steps in forming this 4 micron material in layer of polyimide are the same as those used in forming each of the two 4 micron layers of the polyimide which provide the 8 micron layer below the metalization. No vias are required above the traces.

Figure 8D:
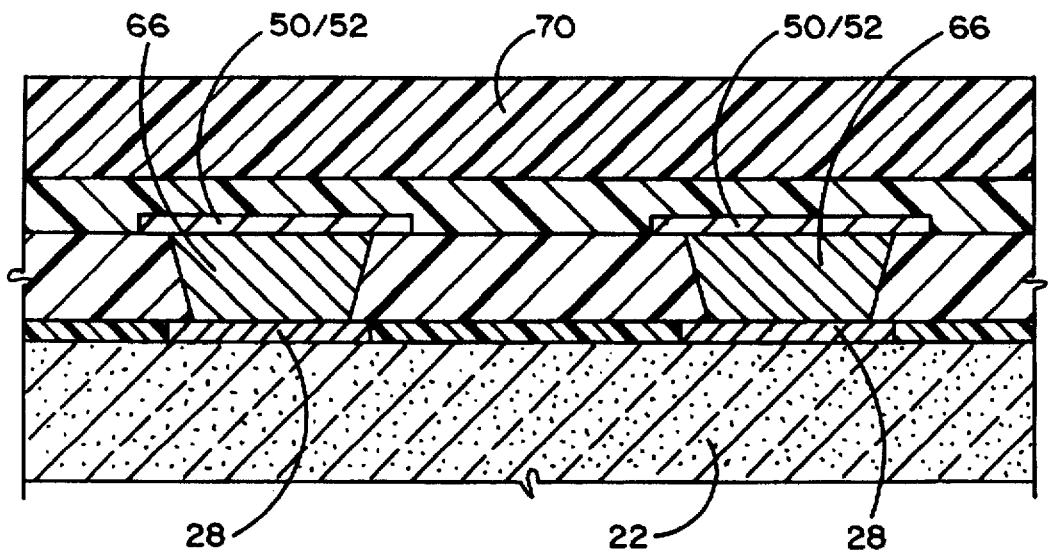

FIG. 8d shows the cross-section of FIG. 8c after a thick layer 70 of adhesive polyimide has been formed as the top polyimide layer of the wafer. This layer uses a different type of polyimide, and the preparation of the layer is only carried through the soft bake step. Final curing of this layer is performed only after the individual chips have been diced from the wafer and stacked.

The use of a final layer of a polyimide as adhesive assumes that a "dry stacking" process will be used to cause adhesion of the chips in the stack. This dry stacking process the subject of a co-pending common assignee application Ser. No. 421,848, filed Apr. 14, 1995. If the final layer of polyimide is not intended for adhesion, it will be the same as the other three 4 micron layers. If dry stacking is not used, another type of adhesive, e.g., an epoxy, may be used.

If the dry stacking adhesion method is used, the layer 70 is put down as a six or seven micron thick layer of a different kind of polyimide, which is not a condensation polyimide, but instead is a cross-linkable polyimide material. The polyimide adhesive is cast as the last layer and a soft bake is used on that particular polyimide layer.

The soft bake doesn't cross-link the layer 70, it just drives the solvent out. At that point, above the metal traces, there are ten to twelve microns of total dielectric material. In other words, the adhesive layer is 6–8 microns thick before the lamination of the stack. After the stack of individual chips has been laminated under-pressure, the layer 70 will be compressed to a thickness of about 4 microns.

After completion of the wafer level processing derailed in the discussion of FIGS. 8a–8d, the further steps involve cutting the chips from the wafer, as represented in FIGS. 1b and 1c, and then, as represented in FIG. 1d, stacking numerous chips in a laminating fixture, in which adhesion of the chips is obtained under pressure and heat, which causes cross-linking of the adhesive material. Thereafter, as represented in FIG. 1e, the access plane surface of the stack is subjected to passivation and metalization steps. This processing of the access plane is a key portion of the present invention.

Figure 9:
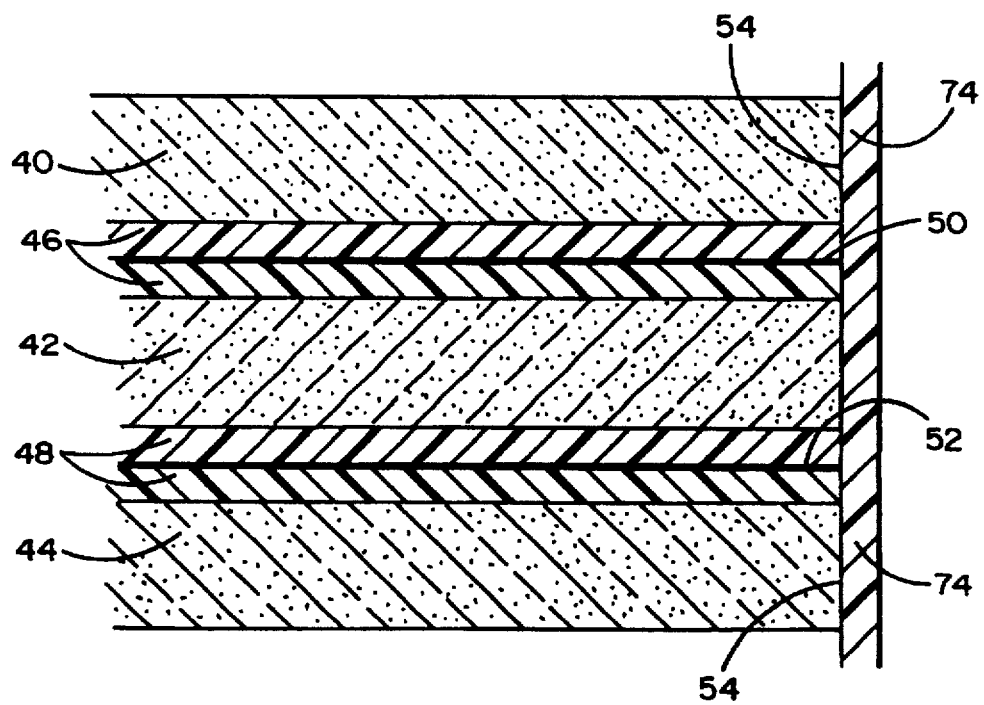
FIG. 9 is a sectional view similar to FIG. 6, except that a layer of dielectric material covers the access plane of the stack.

FIG. 9 is a section showing a small portion of the laminated stack of chips. It is identical to FIG. 6, except that a layer 74 of passivation (dielectric material) has been formed covering the access plane 54. Layer 74 is preferably formed of polyimide material selected for its dielectric properties. The material may be the same as, or similar to, that which, in FIG. 7, formed layer 60 and the lower portion of layer 62 (e.g., "DuPont 2555" polyimide or "DuPont 2611" polyimide). The layer 74 of dielectric material may be up to about 4 microns thick. In general, a thinner layer provides advantages in the manufacturing process.

Figure 10:
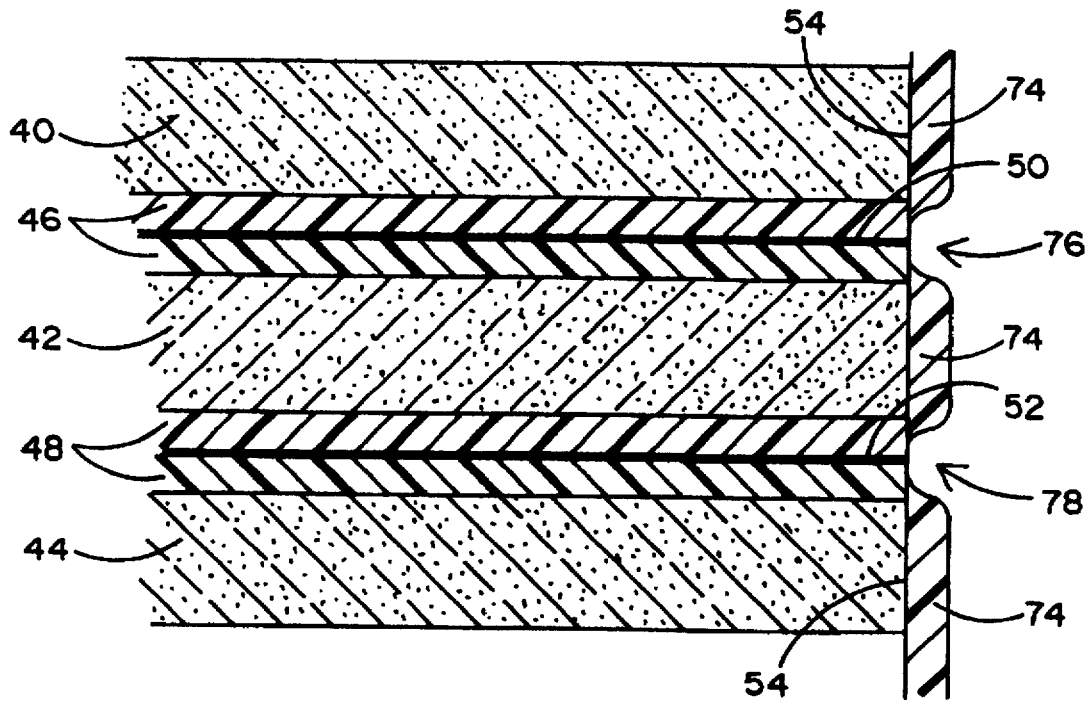
FIG. 10 is the same as FIG. 9, except that lead-exposing trenches have been formed in the layer of dielectric material.

FIG. 10 is a section which is the same as FIG. 9, except that openings 76 and 78 have been made in the passivation layer 74, in order to expose the ends of the leads (traces) 50 and 52. This permits metalization on top of the access plane, in order to provide exterior electrical contact, by means of terminals formed within the openings 76 and 78 in T-connect engagement with the exposed ends of the leads 50 and 52.

The preferable shape of each of the openings 76 and 78 is an elongated trench extending parallel to, but spaced from, the silicon chip edges which lie in planes above and below each trench. A single trench thus exposes a large number of parallel leads which are connected to the integrated circuitry in a given chip.

Figure 11:
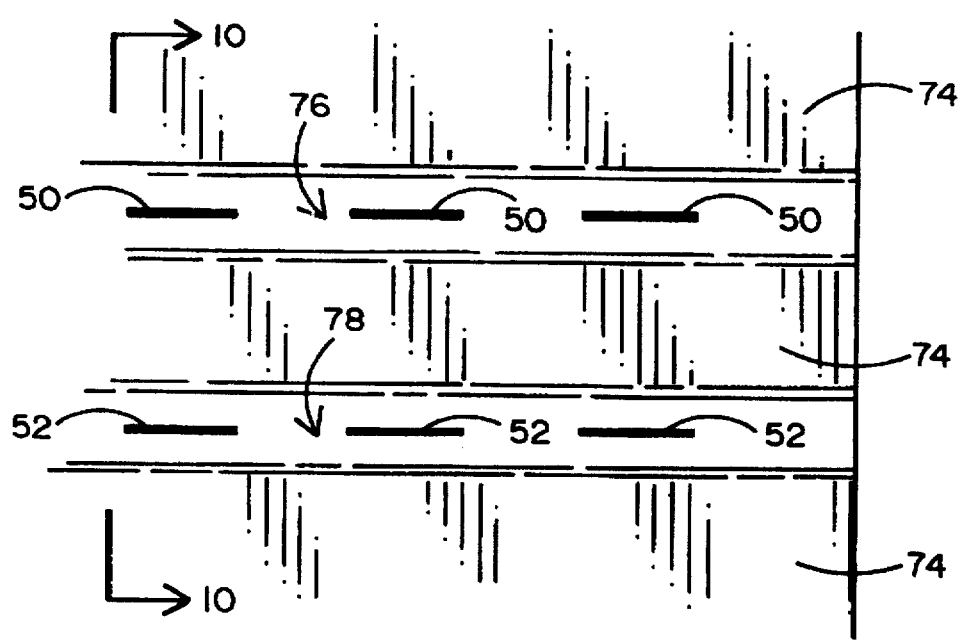
FIG. 11 is a top view of a portion of the access plane showing the trenches and exposed leads of FIG. 10.

FIG. 11 is a plan view showing a small portion of the stack access plane 54, on which trenches 76 and 78 have been formed in the dielectric layer 74, each trench exposing a series of leads 50 and 52. The cross-sectional area of each lead may be about 2 microns thick and about 50 microns wide. The width of each lead is limited by the available spacing between parallel leads along a given chip.

The leads 50 and 52 must be insulated from the semiconductor chips. Therefore, the width of each trench, as seen in FIGS. 10 and 11, is preferably less than one-half of the distance between adjacent chips. As described above, the total dielectric thickness between two adjacent chips is about 16 microns, and thus, the width of each trench may be up to approximately 8 microns.

Figure 12:
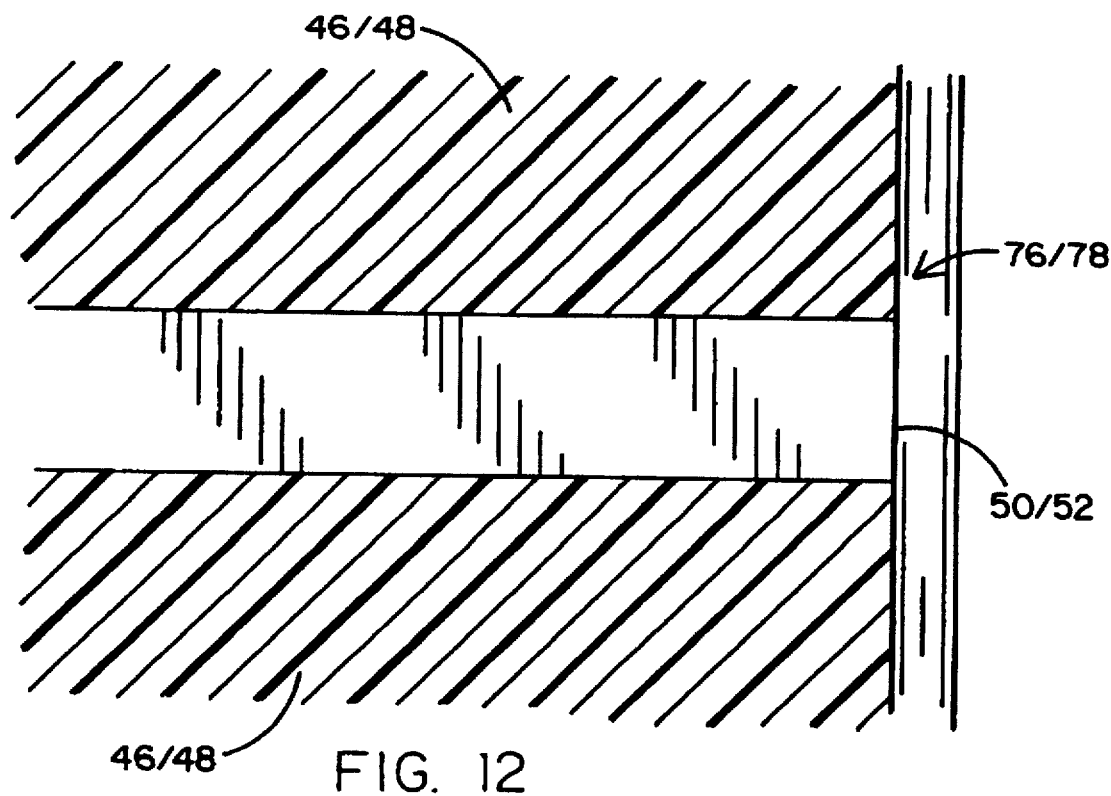
FIG. 12 is a sectional view taken at right angles to those of FIGS. 9 and 10.

FIG. 12 is a section taken along the center line of one of the trenches, parallel to the planes of the silicon chips. A 50 micron wide lead (50/52) is shown, embedded in the dielectric material which separates two silicon chips lying above and below the plane of the figure.

At this point it will be useful to detail the process steps during the progression from FIG. 9 to FIG. 12, i.e., the steps beginning after the stack of chips has been removed from the laminating fixture represented in FIG. 1d. First the face of the stack, i.e., its "access plane", is lapped and polished to planarize the surface and assure that the leads are exposed. The silicon, the polyimide which was previously applied at the wafer level, and the metal leads which were previously formed at the wafer lever, are all now coplanar. The next step is to apply the layer 74 of dielectric material, preferably a condensation cured polyimide. When a relatively thin film is cast, the condensation cure materials are easy to use, are readily available, and are the most cost effective selection. So in this case a film would be cast, preferably less than four microns thick. The preferred approach is to put down a relatively thin layer of passivation on the access plane. The thinner film on the access plane is preferable, because the openings (e.g., trenches 76, 78) are easier to form, i.e., the width of the trenches can be controlled more accurately.

Subsequent steps are similar to those performed at the wafer level. After casting the layer 74 of polyimide on the access plane, the layer is soft baked, driving off the solvent, but not completing the condensation cure. The layer material is in the form of a polyamic acid. Then a layer of photoresist is spun on. And thereafter, a photo lithographic exposure through a photo mask defines, in this orthogonal plane, a set of trenches which reach down to the ends of the T-connect traces that were previously exposed. Separate oval-shaped vias could be opened through layer 74 at each trace, but it is preferable, for manufacturing reasons, to remove entire strips of access plane passivation material 74, extending all the way across each strip of T-connect leads for any given IC chip. So, in effect, a trench is opened from one edge of the stack to the other edge of the stack, exposing all of the parallel leads. That makes the photo lithography process much easier, in that alignment is only critical in a single axis instead of in two axes.

The photo mask will basically have a strip which lines up with the T-connect lead structure for each layer of silicon in the stack. The photo mask strip will usually be about half the width of the total dielectric material between adjacent silicon chips. The photoresist layer is then exposed and developed. The developer removes both the exposed photoresist and the underlying polyamic acid material, providing via trenches which expose the existing metalization ends of the leads which will become T-connects. At this point, the structure of the chip stack is very similar to the same structure produced if the long-standing prior process had been used, comprising silicon etch back, wet and/or dry etch, passivation, and lead clearing. But all of those steps are no longer necessary.

Figures 13A, 13B, 13C, 13D:
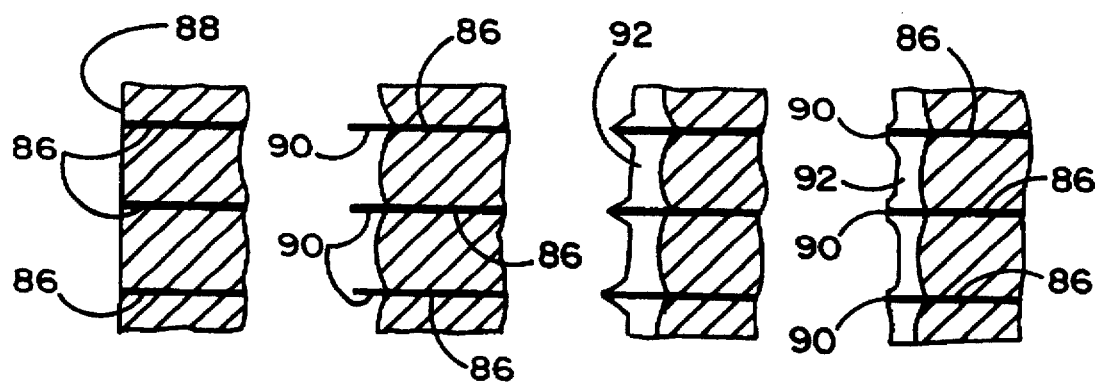
FIGS. 13a–13d are sectional views of a stack of chips, representing the steps in the prior etch-back process.

For the purpose of comparison, FIGS. 13a-13d show a cross-sectional view representing the steps in the prior etch-back process, which is replaced by the present process. FIGS. 13a-13d correspond to FIGS. 5a-5d of U.S. Pat. No. 4,525,921. In FIG. 13a, a stack of silicon chips is shown in cross section, with metallic leads (traces) 86 between adjacent chips (insulation between layers is not shown). The left end of the module has been lapped in order to provide a smooth access plane surface 88 and insure that the leads 86 are exposed. The next step was to etch the edges of the silicon chips. In FIG. 13b, the left edges of the chips have been etched to remove the silicon to a depth of about 0.0005 inch, causing the etch-resistant ends 90 of the leads 86 to protrude, as shown. After that, as shown in FIG. 13c, the passivation layer 92 was deposited on the access plane ends of the stacked chips. And finally, as illustrated in FIG. 13d, the left end of the stacked chip module was lapped, in order to uncover the tips 90 of leads 86 without removing the passivation layer 92 from the edges of the silicon chips.

In the etch-back process of FIGS. 13a-13d, a very thin adhesive was used, and the space between adjacent stacked chips was intentionally minimized. That process may continue to be valued in certain situations. However, in stacks of chips intended for such purposes as computer memories, the importance of manufacturing simplicity is paramount, and the chip stacks, even with thicker layers between chips, provide electronic density which is orders of magnitude greater than predecessor structures.

Returning to the description of the present process, preparing for metalization on the access plane is next after the trenches 76 and 78 have been formed in the dielectric layer 74. The purposes of metalization at this point are (1) to provide metal which forms T-connect terminals on each of the exposed leads 50 and 52 and (2) to provide terminal pads and buses such as those seen in FIGS. 3 and 4 (identified as buses 36 and pads 38).

At this point in the final process, an additional layer of photoresist is put down covering the access surface (including the dielectric layer 74 and the trenches 76 and 78). An additional photo mask delineates the metalization pattern that is desired on the face of the stack. It is exposed and developed. Then, in the preferred process of record, metal is evaporated into the features that were designed in the photoresist to form the interconnect structure on the face of the stack. Then a lift off process is performed, in such a way that the features in the photoresist when the metal is evaporated into them cause discontinuities between the metal layer that is evaporated on the top of the photoresist and the metal layer that is evaporated down into the features inside the photoresist. Peeling off the excess metal and cleaning the surface of the stack complete the metalization process.

Figure 14:
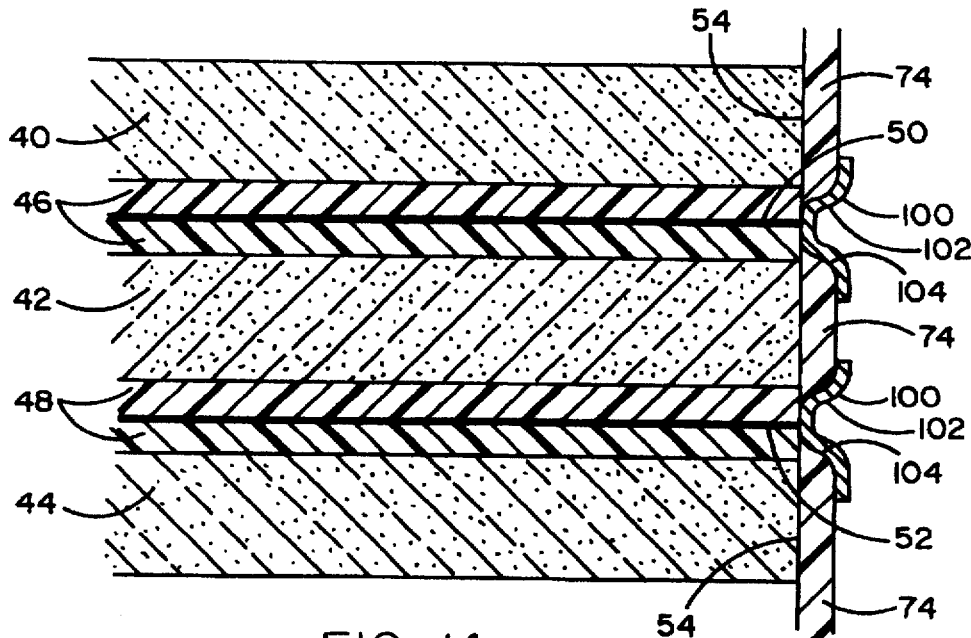
FIG. 14 is the same as FIG. 10, except that metal terminals have been formed in the trenches to contact the exposed leads at the access plane edges of the chips.

FIG. 14 is a section which is the same as FIG. 10, except that metal terminals 100 have been formed (preferably by evaporation) in contact with all of the leads 50 and 52, thus providing T-connect electrical connections available on top of the access plane. Each terminal 100 has metal which extends down the sides 102 and 104 of the respective trench to engage the leads 50 and 52. The upper edges of terminals 100 overlap the top surface of passivation layer 74. In cases where a terminal 100 is in contact with a bus interconnecting several chips, the metal at the top of the terminal extends across the face of the dielectric layer to make contact with a lead 50/52 exposed at the face of the next trench.

It is not necessary to fill in the trenches. The metalization may extend over the edge of a trench, down to the bottom of the trench, and up the other side of the trench. It is not necessary that the trench area be co-planar with the top of the passivation layer.

Figure 15:
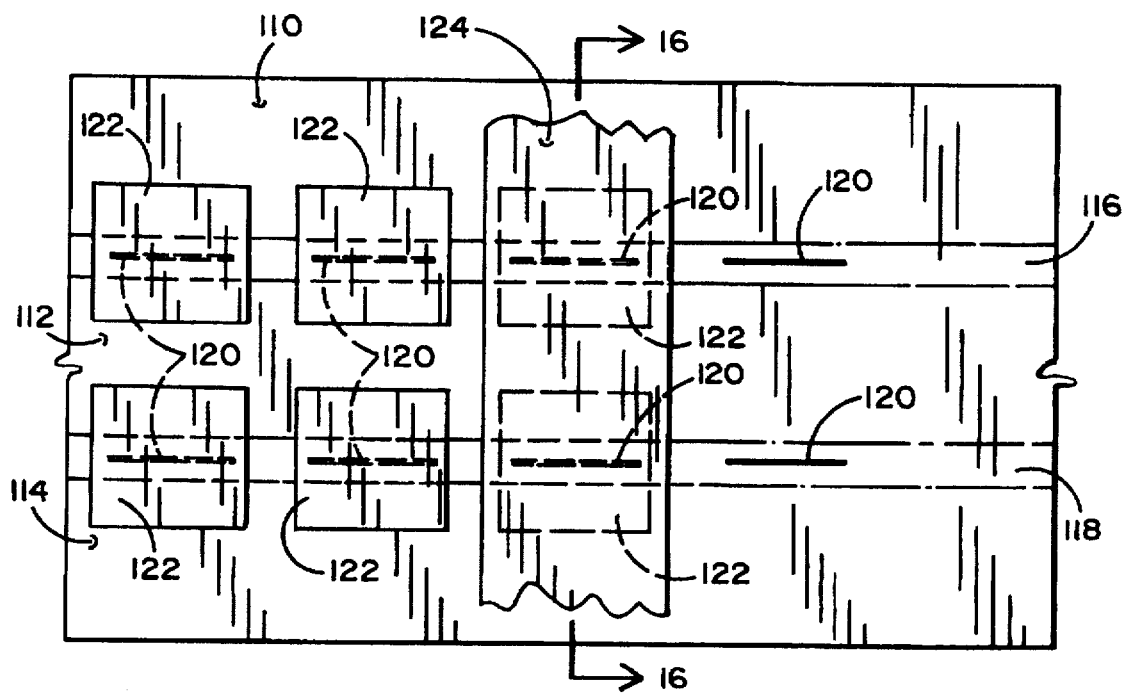
FIG. 15 is a top view of part of the access plane, after metalization has been applied.

FIG. 15 is a plan view of part of an access plane, showing metalization in place. Three passivation covered areas 110, 112 and 114 are shown, each protecting a silicon IC chip. Two trenches 116 and 118 are shown, opening the passivation down to the exposed leads 120, which are in electrical contact with the integrated circuitry of the respective IC chips. The edges of the trenches must be reasonably spaced from the edges of nearby chips, in order to avoid short circuiting.

Figure 16:
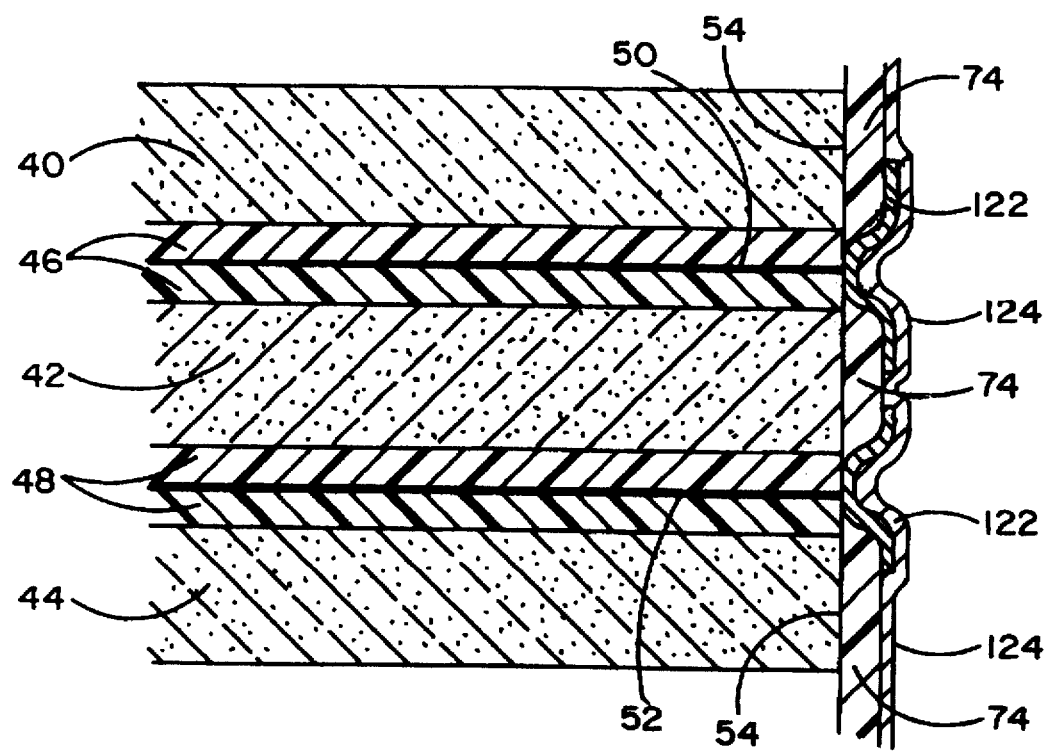
FIG. 16 is a section taken on the line 16—16 of FIG. 15.

Metal pads 122 and a metal bus 124 are shown on top of the access plane, and in electrical contact with the leads 120. FIG. 16 is a cross-section on line 16—16 of FIG. 15, taken through the length of bus 124, and showing the undulations of the metalization as it extends across the face of the access plane. The metalization travels along the top of the passivation, goes down a hill at the edge of the trench to the bottom, comes across an interconnect to provide the T-connect, goes back up the hill on the other side, and continues. The trench and the recessed T-connect may ultimately be electrically connected to a solder joint or to a wire bond.

The trenches or vias opened through the access layer passivation down to the ends of the metal traces must be small enough, in the axis orthogonal to the plane of the stacked IC chips, to lie completely within the dielectric thicknesses between the traces and the silicon (above and below the traces).

The trenches or vias in the access plane passivation may be opened by any suitable process. In addition to standard wet lithographic processing, alternatives include photolithographic techniques combined with plasma processing, and laser ablation of the passivation.

The dielectric thickness in the stack above and below the traces must be some minimum which is a function of the dimensional capability of equipment used to form the trenches or vias.

In summarizing the important features of the present invention, it is noted that the metal traces embedded in the dielectric are substantially spaced from both of the nearby silicon layers. This spacing has two advantages, as already stated. It provides desired electrical isolation, and it also provides adequate spacing to permit the formation of trenches or vias which keep the metalization on the access plane well isolated from the silicon. The use of 16 micron thicknesses of dielectric between chips makes the trench formation readily feasible, using current photolithographic technology.

A benefit from the present invention which was not initially appreciated is the fact that it permits the highly developed aluminum technology to be more readily used throughout the process.

The simplification of the process by eliminating difficult steps, the substantial conservation of silicon material (by eliminating etch back), and the accomplishment of key steps at the wafer level, are all significant benefits.

From the foregoing description, it will be apparent that the processes and products disclosed in this application will provide the significant functional benefits summarized in the introductory portion of the specification.

The following claims are intended not only to cover the specific embodiments disclosed, but also to cover the inventive concepts explained herein with the maximum breadth and comprehensiveness permitted by the prior art.

What is claimed is:

1. A process of forming a unitary stack of IC chips containing integrated circuitry as part of a dense electronic package having an access plane, comprising these steps;

forming a plurality of individual IC chips for inclusion in the stack, each having at least one access plane edge;

forming layers of dielectric material for separating and insulating each chip from adjacent chips in the stack;

embedding conductive traces in the dielectric material between each pair of adjacent chips, said traces electrically connecting the integrated circuitry to the access plane;

including adhesive material between a layer of dielectric material and an adjacent chip;

stacking the chips;

causing the adhesive material to hold the stack as an integrated structure;

said structure having an access plane provided by coplanar edges of the stacked chips and coplanar edges of the dielectric chip-separating layers, at which access plane ends of the embedded traces are exposed;

forming a separate dielectric layer on top of the access plane;

removing material from certain areas of said separate dielectric layer to form openings which reach down to the access plane ends of the traces; and depositing metalization on the access plane to provide terminal connections for the traces;

the conductive traces embedded between each pair of adjacent chips in the stack being spaced from each adjacent chip by a dielectric material sufficiently thick to ensure that the openings which reach down to the access plane ends of the traces do not uncover any portion of any chip surface.

2. The process of claim 1 wherein:

the traces embedded in the dielectric layers are located in planes between and spaced from the adjacent IC chips by dielectric material having a thickness of at least four microns, providing a total spacing between adjacent chips of at least 8 microns.

3. The process of claim 2 in which the traces are spaced from the adjacent IC chips by dielectric material having a thickness of at least approximately eight microns, providing a total spacing between adjacent chips of at least 16 microns.

4. The process of claim 1 in which:

the width of the dielectric material removed to expose the ends of the traces is no greater than approximately half of the thickness of dielectric material between adjacent IC chips.

5. The process of claim 1 in which:

the openings in the dielectric layer on the access plane are formed using conventional photolithographic processes.

6. The process of claim 1 in which:

the metalization which provides terminal connections for the traces extends beyond the thickness of the respective traces in order to provide T-connect terminal connections.

7. The process of claim 1 in which:

polyimide material is applied to the access plane of the stack by spinning the stack to spread the polyimide material;

the polyimide material is then heated to remove solvent; and the polyimide material is subsequently cured.

8. The process of claim 1 in which polyimide material is removed to expose the access plane ends of the traces by:

applying a layer of photoresist material to cover the dielectric layer on the access plane;

using photo masking to delineate trenches in the access plane polyimide material; and simultaneously dissolving the photoresist material and the underlying polyimide material to form trenches which expose the access plane ends of a plurality of parallel traces.

9. The process of claim 1 in which:

the individual chips are diced from a wafer containing numerous chips in a planar array;

the layers of chip-separating dielectric material are formed on the surface of the wafer; and the parallel traces are formed on the surface of a layer of dielectric material covering the wafer.

10. The process of claim 1 in which the access plane terminal connections for the traces lie in the same plane as the coplanar edges of the stacked chips which provide the access plane.

11. The process of claim 1 in which the sole process step performed on the access plane after the stack becomes an integrated structure and before forming a separate dielectric layer on top of the access plane, is planarizing the access plane to remove any protruding material and to assure that the ends of the traces are exposed.

12. The process of claim 1 in which the traces embedded in the dielectric material are formed of essentially the same conductive material as the integrated circuitry.

13. The process of claim 12 in which the conductive material is aluminum.

14. A method for forming a unitary stack of IC chips containing integrated circuitry as part of a dense electronic package having an access plane, comprising these steps;

providing a wafer having a substantially planar surface and containing numerous IC dice having terminals at the wafer surface;

forming on the surface of the wafer a first layer of dielectric material;

forming openings in the first dielectric layer to reach the terminals;

metalizing to provide separate leads which contact the terminals through the openings and which provide traces supported by the first dielectric layer and extending toward a common edge;

forming a second layer of dielectric material covering the traces;

dicing the wafer to provide numerous layers each having an IC chip and dielectric material thereon, and each having traces terminating at the same layer edge;

stacking the layers in such a way that a stack access plane is created containing parallel layer edges;

securing the stacked layers together to form a unitary structure in which both the IC chips and the traces extend to the access plane;

covering the access plane with a layer of dielectric material;

forming trenches in the access plane dielectric layer, each of which reaches the ends of a plurality of aligned traces in the stack; and metalizing the access plane to provide terminal connections for the traces, without interconnecting said aligned trace ends reached by a trench.

15. The process of claim 14 in which the minimum thickness of dielectric between adjacent chips is sufficient to permit forming the trenches through the dielectric layer on top of the access plane without exposing any chip surface.

16. The process of claim 15 in which the traces embedded in the dielectric layers are located in planes between and spaced from the adjacent IC chips by dielectric material having a thickness of at least four microns, providing a total spacing between adjacent chips of at least 8 microns.

17. The process of claim 16 in which the traces are spaced from the adjacent IC chips by dielectric material having a thickness of at least approximately eight microns, providing a total spacing between adjacent chips of at least 16 microns.

18. The process of claim 14 in which the width of the trenches is no greater than approximately half the thickness of the dielectric material between adjacent IC chips.

19. The process of claim 14 in which the trenches in the dielectric layer on the access plane are formed using conventional photolithographic processes.

20. The process of claim 14 in which the metalization which provides terminal connections for the traces extends beyond the thickness of the respective traces in order to provide T-connect terminal connections.

* * * * *